United States Patent
Kang et al.

(10) Patent No.: US 6,541,762 B2
(45) Date of Patent: Apr. 1, 2003

(54) SUB CHIP ON BOARD FOR OPTICAL MOUSE

(75) Inventors: Dong-Hoon Kang, Seoul (KR); Joon-Ki Paik, Suwon (KR)

(73) Assignee: Samsung Electro-Mechanics Co., Ltd., Kyunggi-Do (KR)

( * ) Notice: Subject to any disclaimer, the term of this patent is extended or adjusted under 35 U.S.C. 154(b) by 0 days.

(21) Appl. No.: 09/984,283

(22) Filed: Oct. 29, 2001

(65) Prior Publication Data

US 2003/0034441 A1 Feb. 20, 2003

(30) Foreign Application Priority Data

Aug. 14, 2001 (KR) ..................................... 2001-0049056

(51) Int. Cl.[7] .............................. H01J 40/14; H01J 5/02
(52) U.S. Cl. ........................ 250/239; 250/221; 257/433; 345/163
(58) Field of Search .............................. 250/214.1, 221, 250/222.1, 216, 239; 257/432, 433, 434, 81, 82; 345/163

(56) References Cited

U.S. PATENT DOCUMENTS

| | | | | |
|---|---|---|---|---|
| 4,521,772 A | * | 6/1985 | Lyon | ........................... 345/166 |
| 4,704,525 A | * | 11/1987 | Shimaoka et al. | .......... 250/239 |
| 4,751,505 A | * | 6/1988 | Williams et al. | ............. 345/166 |
| 5,783,815 A | * | 7/1998 | Ikeda | ....................... 250/208.1 |
| 6,369,380 B1 | * | 4/2002 | Hirai | .......................... 250/239 |

\* cited by examiner

*Primary Examiner*—Stephone Allen
*Assistant Examiner*—Eric Spears
(74) *Attorney, Agent, or Firm*—Morgan, Lewis & Bockius LLP

(57) ABSTRACT

A sub chip on board for an optical mouse is disclosed. The chip on board has a sub PCB having both a plurality of input/output pads and a plurality of pin holes. A sensor die has an optical sensor wire-bonded to said input/output pads for sensing received light, and is attached to a bottom surface of the sub PCB. A transparent resin covers the sensor die at the bottom surface of the sub PCB. A cap is attached to the bottom surface of the sub PCB such that the cap covers the transparent resin, and has a hole for guiding the received light to said optical sensor. A main PCB has both a hole for guiding the received light to the optical sensor and a plurality of pin holes corresponding to the pin holes of the sub PCB. A plurality of pins are commonly inserted into the pin holes of both the main PCB and the sub PCB.

2 Claims, 3 Drawing Sheets

SUB CHIP ON BOARD FOR OPTICAL MOUSE

BACKGROUND OF THE INVENTION

1. Field of the Invention

The present invention relates in general to a sub Chip On Board (COB) for optical mouse, and more particularly to a sub chip on board formed by directly attaching an IC chip to a sub printed circuit board (hereinafter, referred to as PCB) and mounting the sub PCB on a main PCB with pins.

2. Description of the Prior Art

Generally, an optical mouse is operated by reflecting light emitted from the main body of the optical mouse from a touching object (for example, a mouse pad), thus, enabling the movement of the mouse on the pad to be detected and enabling a cursor on a computer monitor to be moved. The optical mouse is a pointing device (or a display cursor control device) clicked by the user, and an input device independent of a keyboard. Particularly, the optical mouse has several advantages such as its precise detection of a movement of user's hand and its smooth movement, compared with a conventional ball mouse, thus its use increasing more and more. Such an optical mouse optically recognizes its movement on the touching object, converts the recognized value to an electric signal, transmits the electric signal to the computer, and thereby the position of the cursor on the monitor can be recognized.

FIG. 1 is a side view showing a conventional optical mouse. Referring to FIG. 1, the optical mouse 10 includes a light emitting unit 12, a lens 13, an IC chip 15 having an optical sensor 16, and a PCB 14 in a casing 11. Further, at the top of the mouse 10, a button 18 for being clicked by the user is arranged. The light emitting unit 12 has a conventional LED (Light Emitting Diode) for emitting light, and the lens 13 concentrates the light reflected from the mouse pad 20. The optical sensor 16 of the IC chip 15 senses the concentrated light. The PCB 14 is connected to the IC chip 15 through a lead frame 19.

In the optical mouse 10, if the light emitting unit 12 emits light, the light is radiated to the mouse pad 20. The radiated light is reflected from the mouse pad 20. At this time, the reflected light from the mouse pad 20 is concentrated by the lens 13. If the concentrated light from the lens 13 is projected to the optical sensor 16, the optical sensor 13 senses the projected light, thus recognizing the movement of the mouse 10 on the pad 20. As described above, the optical mouse 10 senses the light, and so the moving direction and distance of the mouse 10 is recognized. The recognition result is converted into an electric signal, and the electric signal is transmitted to a computer. Thereby, the user moves the optical mouse 10 on the mouse pad 20 to display the position of the cursor on the monitor.

Further, the optical mouse requires a construction enabling it to recognize received light and transmit it to the PCB. The construction for arranging the PCB and IC chip in an optical mouse is disclosed in U.S. Pat. Nos. 4,521,772 and 4,751,505. Referring to the optical mouse construction disclosed in U.S. Pat. No. 4,521,772, an IC chip having a sensor array is separated from a PCB, and is attached to a support element arranged vertically on the PCB. Further, referring to the optical mouse construction disclosed in U.S. Pat. No. 4,751,505, a packaged IC circuit device having a plurality of pins is mounted on a PCB.

FIGS. 2 and 3 are views showing the construction of a conventional chip on board mounted in a typical optical mouse. Referring to FIGS. 2 and 3, an IC chip 150 having an optical sensor 160 is manufactured in a package, and the packaged IC chip 150 is mounted on a PCB 100. The IC chip 150 having the optical sensor 160 is wire-bonded to a lead frame 170. Further, transparent resin 190 is spread on the bottom surface of the IC chip 150. Further, a cap 180 having a hole 181 for passing received light is covered on the transparent resin 190. As described above, a chip on board manufacturer purchases fully-packaged IC chips having the above construction, and mounts them on the PCBs 100. Referring to FIGS. 2 and 3, in the construction of the conventional chip on board, the IC chip 150 is mounted on the PCB 100 through the lead frame 170, and is supported by the lead frame 170, thus being arranged on the PCB 100. Further, a path 101 for guiding received light is arranged on the PCB 100.

On the other hand, in U.S. Pat. No. 4,751,505, a construction for mounting a packaged IC chip having pins without lead frames on a PCB is disclosed. However, the construction disclosed in U.S. Pat. No. 4,751,505 is problematic in that its manufacturer must purchase the packaged IC chips from the chip manufacturer and mount them on the PCBs, in the same manner as that described for the chip on board of FIGS. 2 and 3.

As described above, the conventional chip on board for optical mouse is disadvantageous in that a chip on board manufacturer must purchase fully-packaged sensor IC chips, including lead frames used for bonding the IC chips to PCBs, from a chip manufacturer, and mount the chips on the PCBs. Moreover, the conventional chip on board is problematic in that it requires a casing for protecting the packaged IC chip, thus increasing the manufacturing costs and decreasing the manufacturing efficiency.

SUMMARY OF THE INVENTION

Therefore, the present invention has been made in view of the above problem, and it is an object of the present invention to provide a sub chip on board for optical mouse, for directly attaching a sensor die having an optical sensor to the bottom surface of a sub PCB, directly wire-bonding the optical sensor to the sub PCB, and mounting the sub PCB on a main PCB with pins, thus reducing the manufacturing costs and improving the manufacturing efficiency.

It is another object of the present invention to provide a sub chip on board for optical mouse, having a sub PCB having a sensor die directly attached on the bottom surface of the sub PCB.

In accordance with one aspect of the present invention, the above and other objects can be accomplished by the provision of sub chip-on board for optical mouse, comprising a sub PCB having both a plurality of input/output pads and a plurality of pin holes; a sensor die having an optical sensor wire-bonded to said input/output pads for sensing received light, and being attached to a bottom surface of the sub PCB; a transparent resin covering the sensor die at the bottom surface of the sub PCB; a cap attached to the bottom surface of the sub PCB such that the cap covers the transparent resin, and having a hole for guiding the received light to said optical sensor; a main PCB having both a hole for guiding the received light to the optical sensor and a plurality of pin holes corresponding to the pin holes of the sub PCB; and a plurality of pins commonly inserted into the pin holes of both the main PCB and the sub PCB such that the sub PCB is fixed on the main PCB.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE PREFERRED EMBODIMENTS

The sub chip on board of the present invention is formed by providing a sub PCB, directly attaching a sensor die to the sub PCB, and mounting the sub PCB on a main PCB with pins, compared with the conventional chip on board formed by mounting an IC chip package in which a sensor is wire-bonded to a lead frame on a PCB.

Figure 1:
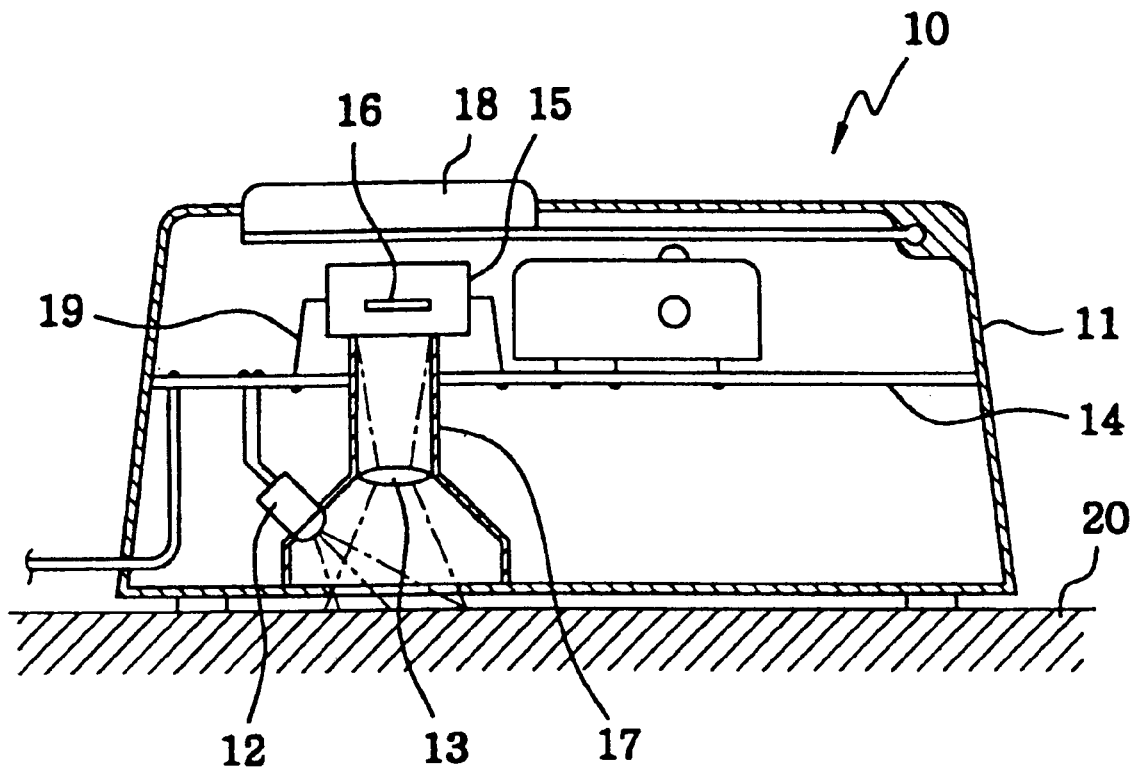
FIG. 1 is a side view showing the construction of conventional optical mouse.
Figure 2:
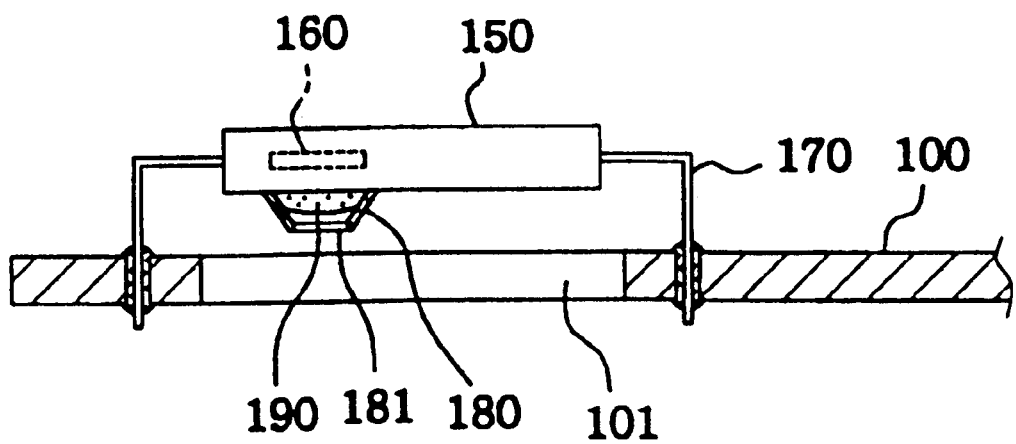
FIG. 2 is a side view showing a conventional chip on board for optical mouse.
Figure 3:
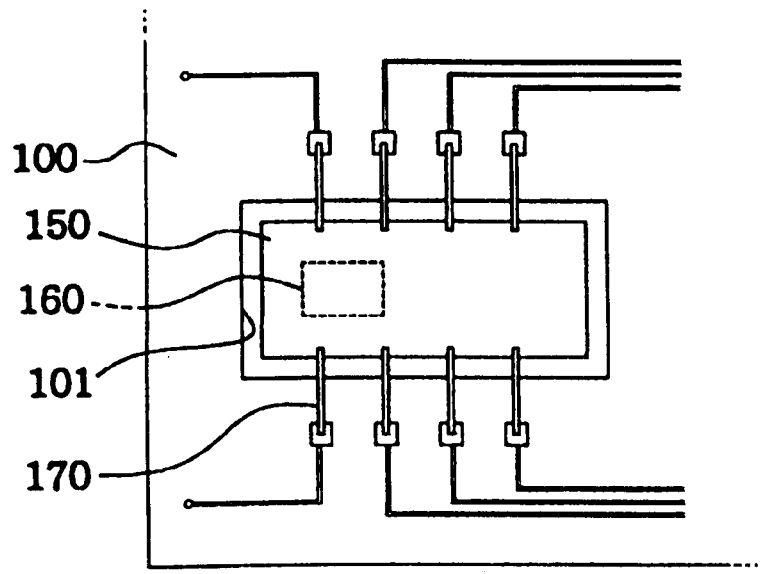
FIG. 3 is a plane view showing the chip on board of FIG. 2.
Figure 4:
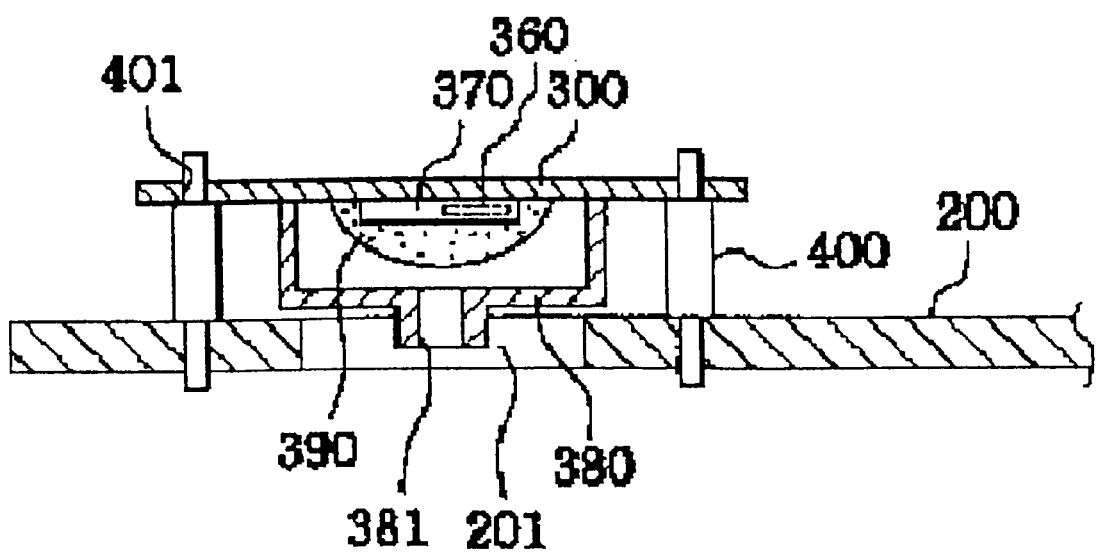
FIG. 4 is a side view showing a sub chip on board for optical mouse according to the preferred embodiment of the present invention.
Figure 5:
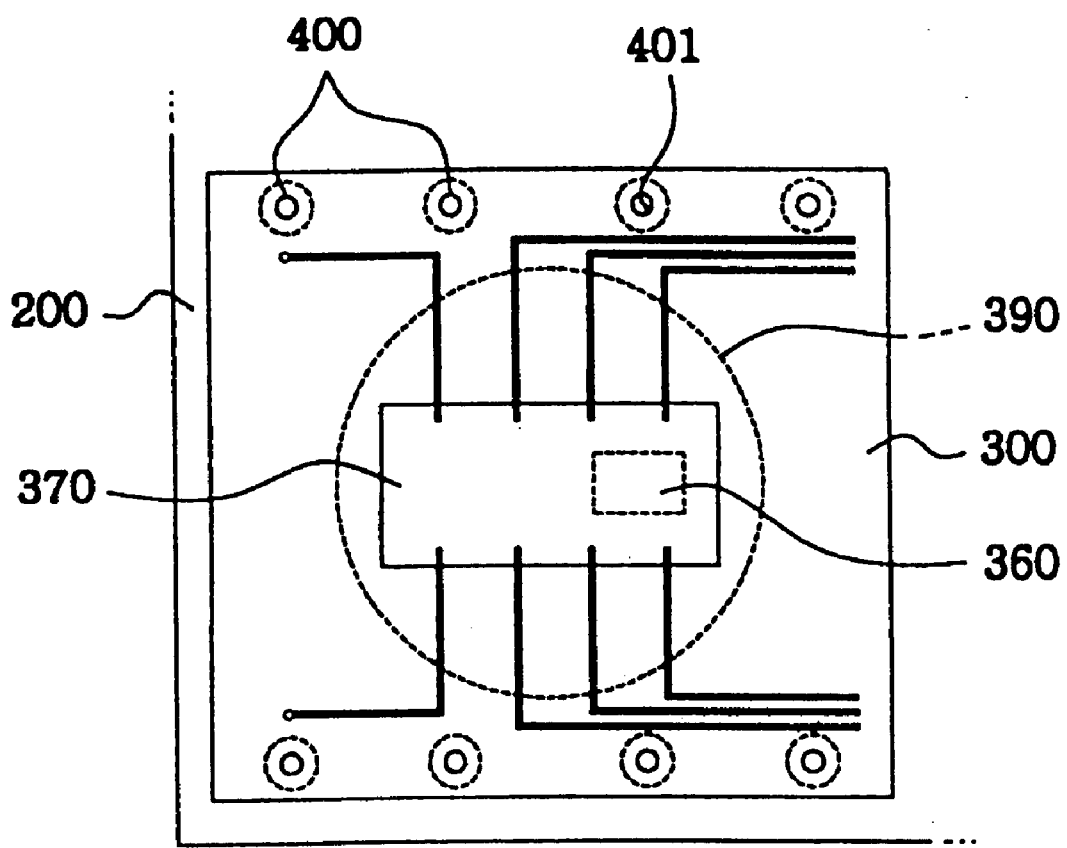
FIG. 5 is a plane view showing the sub chip on board for optical mouse of this invention.

FIG. 4 is a side view showing a sub chip on board for optical mouse according to the preferred embodiment of the present invention, and FIG. 5 is a plane view showing the sub chip on board.

Referring to FIG. 4, in the sub chip on board of this invention, a sensor die 370 having an optical sensor 360 is directly attached to the bottom surface of a sub PCB 300. At the bottom surface of the sub PCB 300, a transparent resin 390 is spread to cover the sensor die 370. Further, a cap 380 is put on the transparent resin 390. As shown in FIG. 5, the sub PCB 300 is directly connected to the optical sensor 360 by wire-bonding the input/output pads of the sub PCB 300 to the optical sensor 360.

The transparent resin 390 covering the sensor die 370 is used for passing light to allow the sensor 360 to sense the light reflected from a mouse pad(not shown). Further, the transparent resin 390 protects both the optical sensor 360 and bonded wires from external shock or impurities, and fixes the sensor die 370 on the sub PCB 300 stably.

At the outside of the transparent resin 390, the cap 380 is put on, to protect the optical sensor 360 and the transparent resin 390. Further, a hole 381 is formed in the cap 380 in order to guide the light reflected from the mouse pad to the sensor 360.

Referring to FIGS. 4, and 5, the sub PCB 300 is fixed on the main PCB 200 with a plurality of pins 400. On the sub PCB 300 and the main PCB 200, a plurality of pin holes 401 for inserting the pins 400 are formed. Further, another hole 201 is formed on the main PCB 200 for guiding the received light to the optical sensor 360.

As described above, the chip on board of this invention provides a sub PCB, and directly attaches a sensor die to the bottom surface of the sub PCB, and fixes the sub PCB on the main PCB, while in the conventional chip on board, a packaged IC chip is mounted on the PCB with a lead frame.

Accordingly, the present invention is advantageous in that it does not require any conventional IC chip package, and provides a sub PCB for directly seating a sensor die, and fixes the sub PCB on a main PCB with pins, thereby improving the manufacturing efficiency and providing a simple and stable construction of a chip on board.

As apparent from the above description, the present invention provides a sub chip on board for optical mouse, which does not require any lead frame contained in a conventional IC chip package or any casing, thus reducing the manufacturing costs. Further, the present invention provides a sub chip on board for optical mouse, which provides a sub PCB, and directly attaches a sensor die on the sub PCB, and fixes the sub PCB on a main PCB with pins, thus simplifying its construction, in addition to improving the manufacturing efficiency.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A sub chip on board for optical mouse, comprising:
    a sub PCB having both a plurality of input/output pads and a plurality of pin holes;
    a sensor die having an optical sensor wire-bonded to said input/output pads for sensing received light, and being attached to a bottom surface of the sub PCB;
    a transparent resin covering the sensor die at the bottom surface of the sub PCB;
    a cap attached to the bottom surface of the sub PCB such that the cap covers the transparent resin, and having a hole for guiding the received light to said optical sensor;
    a main PCB having both a hole for guiding the received light to the optical sensor and a plurality of pin holes corresponding to the pin holes of the sub PCB; and
    a plurality of pins commonly inserted into the pin holes of both the main PCB and the sub PCB such that the sub PCB is fixed on the main PCB.

2. An optical mouse including the sub chip on board formed according to claim 1.

* * * * *